US010269811B2

(12) United States Patent
Chi et al.

(10) Patent No.: US 10,269,811 B2
(45) Date of Patent: Apr. 23, 2019

(54) SELECTIVE SAC CAPPING ON FIN FIELD EFFECT TRANSISTOR STRUCTURES AND RELATED METHODS

(71) Applicant: GLOBALFOUNDRIES INC., Grand Cayman (KY)

(72) Inventors: Min-hwa Chi, San Jose, CA (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/114,596

(22) Filed: Aug. 28, 2018

(65) Prior Publication Data

US 2018/0366470 A1    Dec. 20, 2018

Related U.S. Application Data

(62) Division of application No. 15/259,472, filed on Sep. 8, 2016, now Pat. No. 10,096,604.

(51) Int. Cl.
*H01L 27/11* (2006.01)
*H01L 29/78* (2006.01)
(Continued)

(52) U.S. Cl.
CPC .. *H01L 27/1104* (2013.01); *H01L 21/823431* (2013.01); *H01L 21/823475* (2013.01); *H01L 23/535* (2013.01); *H01L 27/0886* (2013.01); *H01L 27/10826* (2013.01); *H01L 27/11* (2013.01); *H01L 29/45* (2013.01); *H01L 29/66545* (2013.01); *H01L 29/66795* (2013.01);
(Continued)

(58) Field of Classification Search
CPC ........... H01L 29/785; H01L 21/823475; H01L 21/823431; H01L 27/10826; H01L 27/0924; H01L 27/0886; H01L 27/11; H01L 27/1104; H01L 2029/7858
See application file for complete search history.

(56) References Cited

U.S. PATENT DOCUMENTS

| 6,677,649 B2 * | 1/2004 | Osada ................... G11C 11/412 257/379 |
| 2014/0327080 A1 | 11/2014 | Hung et al. |
| 2016/0284705 A1 * | 9/2016 | Chung ................ H01L 27/0924 |

OTHER PUBLICATIONS

Rashed et al. "Innovations in Special Constructs for Standard Cell Libraries in Sub 28nm Technologies", IEDM, pp. 248-251, 2013.
(Continued)

*Primary Examiner* — Jose R Diaz
(74) *Attorney, Agent, or Firm* — Anthony Canale; Hoffman Warnick LLC (57) ABSTRACT

FinFET structures and methods of forming such structures. The FinFET structures including a substrate; at least two gates disposed on the substrate; a plurality of source/drain regions within the substrate adjacent to each of the gates; a dielectric disposed between each gate and the plurality of source/drain regions adjacent to each gate; a dielectric capping layer disposed on a first one of the at least two gates, wherein no dielectric capping layer is disposed on a second one of the at least two gates; and a local interconnect electrically connected to the second one of the at least two gates, wherein the dielectric capping layer disposed on the first one of the at least two gates prevents an electrical connection between the local interconnect and the first one of the at least two gates.

10 Claims, 6 Drawing Sheets

(51) Int. Cl.
*H01L 27/088* (2006.01)
*H01L 21/8234* (2006.01)
*H01L 27/108* (2006.01)
*H01L 23/535* (2006.01)
*H01L 29/45* (2006.01)
*H01L 29/66* (2006.01)

(52) U.S. Cl.
CPC .... *H01L 29/785* (2013.01); *H01L 2029/7858* (2013.01)

(56) References Cited

OTHER PUBLICATIONS

U.S. Appl. No. 15/259,472, (Office Action), dated Nov. 30, 2017, 7 pages.
U.S. Appl. No. 15/259,472, (Notice of Allowance), dated Jun. 28, 2018, 8 pages.

* cited by examiner

SELECTIVE SAC CAPPING ON FIN FIELD EFFECT TRANSISTOR STRUCTURES AND RELATED METHODS

CROSS-REFERENCE TO RELATED APPLICATIONS

This application is a divisional of U.S. application Ser. No. 15/259,472, filed on Sep. 8, 2016, currently pending and hereby incorporated by reference in its entirety.

TECHNICAL FIELD

The present disclosure relates generally to integrated circuit structures, and more specifically, to fin field effect transistors (FinFETs).

BACKGROUND

Self-aligned contact (SAC) capping refers to forming an electrical insulating layer on a metal gate of a fin field effect transistor (FinFET). Technology scaling requires smaller and smaller integrated circuit (IC) architecture. As integrated circuits become smaller, the individual circuit components become closer together. In the case of FinFETs, as the integrated circuits become smaller, for example, into 10 nm architecture and beyond, the gate of the FinFETs becomes very close to the trench silicide contacts (TS, local interconnects). The local interconnects provide electrical connections to components on one layer of an integrated circuit. For example, local interconnects may connect source, drain, and gates of different FinFETs on one level of an integrated circuit.

In most integrated circuit designs, the local interconnects are electrically isolated from the gate of the FinFETs. In this case, an SAC cap is formed on the gate. The SAC cap is a dielectric material disposed on the gate that provides electrical isolation between the local interconnects and the gate. With an SAC cap present, the local interconnect can be disposed on the FinFET without shorting the gate. However, in some integrated circuit designs, some of the local interconnect must be electrically connected to some of the gates.

In order to form an electrical connection between a gate with an SAC cap and a local interconnect, a portion of the SAC cap on the gate is removed and a second conductor is placed on the integrated circuit to form an electrical connection between the gate and the local interconnect. As discussed above, an SAC cap is conventionally used when the local interconnects and the gate are very close. In some cases, the local interconnects may cover a portion of the SAC cap on the gate. In this case, it is difficult to remove a portion of the SAC cap by etching because the local interconnect and the SAC cap include different materials. Etching can only remove a portion of the SAC cap not covered by the metal local interconnect. If only a small portion of the SAC cap is removed, it becomes even more difficult to dispose the second conductor through the etched SAC cap to the gate. This process may lead to a poor connection with the gate that may reduce chip yield and increase the number of future failures of the resulting integrated circuit.

BRIEF SUMMARY

In one illustrative embodiment, an integrated circuit structure is provided. The integrated circuit structure includes a fin field effect transistor (FinFET) structure including: a substrate; at least two gates disposed on the substrate; a plurality of source/drain regions within the substrate adjacent to each of the gates; a dielectric disposed between each gate and the plurality of source/drain regions adjacent to each gate; a dielectric capping layer disposed on a first one of the at least two gates, wherein no dielectric capping layer is disposed on a second one of the at least two gates; and a local interconnect electrically connected to the second one of the at least two gates, wherein the dielectric capping layer disposed on the first one of the at least two gates prevents an electrical connection between the local interconnect and the first one of the at least two gates.

In another illustrative embodiment, a static random access memory (SRAM) cell is provided. The static random access memory (SRAM) cell includes a plurality of fin field effect transistor structures (FinFETs including: a substrate, a plurality of gates disposed on the substrate, a plurality of source/drain regions within the substrate adjacent to each of the gates, and a dielectric disposed between each gate and the adjacent source/drain regions; and a dielectric capping layer disposed on at least a first one of the plurality of gates, wherein no dielectric capping layer is disposed on a second one of the plurality of gates.

In yet another illustrative embodiment, a method of forming selective capping on gates is provided. The method includes providing a precursor FinFET structure including: a substrate including a fin region, a plurality of gates disposed on the fin region of the substrate, a plurality of source/drain regions within the fin region of the substrate adjacent to each of the gates, and a dielectric disposed between each gate and the plurality of source/drain regions adjacent to each gate; selectively masking a portion of the plurality of gates; removing a portion of each unmasked gate; and applying a capping layer to replace each removed portion of the gates; and forming a local interconnect between a first one of the plurality of gates with a capping layer and a second one of the plurality of gates without a capping layer, wherein the local interconnect is electrically connected to the second one of the plurality of gates, and wherein the capping layer applied on the first one of the plurality of gates prevents an electrical connection between the local interconnect and the first one of the plurality of gates.

BRIEF DESCRIPTION OF THE DRAWINGS

The present disclosure, as well as the preferred mode of use and further objectives and advantages thereof, will best be understood by reference to the following detailed description of illustrative embodiments when read in conjunction with the accompanying drawings, wherein.

These and other features and advantages of the present disclosure will be described in, or will become apparent to those of ordinary skill in the art in view of, the following detailed description.

DETAILED DESCRIPTION

As stated previously, self-aligned contact (SAC) capping refers to forming an insulating layer on a metal gate of a fin field effect transistor (FinFET). The SAC cap provides electrical isolation between the gate and adjacent local interconnects. In some integrated circuit (IC) designs, most gates must be electrically isolated from local interconnects. However some gates must be electrically connected to a local interconnect, e.g., the "cross-couple" in SRAM and logic standard cells (explained below). In such a design, a SAC cap makes it difficult to form an electrical connection between the capped gate and a local interconnect. Illustrative embodiments of the disclosure provide a FinFET structure with selective SAC capping on the gates of the FinFETs, which decreases manufacturing difficulty and cost, and improves IC reliability by forming SAC caps only on gates designed to be electrically isolated from local interconnects. As explained above, removing SAC caps can be very difficult and result in poor connections to underlying gates that can lead to lower chip yields and increased future failures. In various disclosed embodiments, the SAC cap need not be removed to form electrical connections between gates and local interconnects.

The present description and claims may make use of the terms "a," "at least one of," and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

Figure 1:
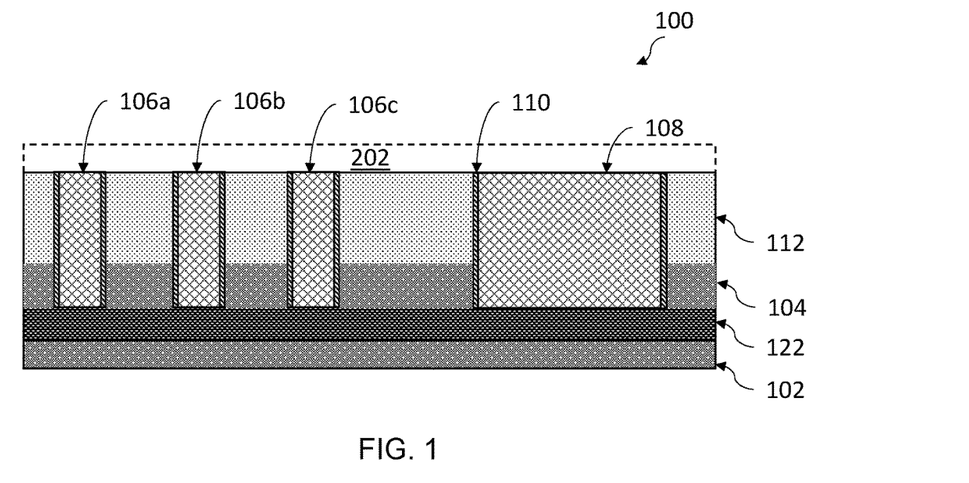
FIG. 1 depicts a cross-sectional view of a precursor middle of the line (MOL) FinFET structure in accordance with an illustrative embodiment.

FIGS. 1-6 depict cross-sectional views of processes of creating a FinFET structure in accordance with various illustrative embodiments. FIG. 1 shows a precursor middle of the line (MOL) FinFET structure 100. MOL refers to a stage of IC manufacturing that takes place after the formation of the FinFETs, and before the formation of a first metallization layer 202, shown in phantom. First metallization layer 202 is later formed on the FinFET structure, and connects the FinFET structure to subsequent layers of the resulting IC. FinFET structure 100 can include a substrate 102. In one embodiment, substrate 102 may include a semiconductor material. In one embodiment, substrate 102 may include silicon. Source/drain regions 104 may be formed on substrate 102. In one embodiment, source/drain regions 104 may be formed by forming trenches (not shown) in substrate 102 on either side of source/drain regions 104. The raised source/drain regions 104 of the substrate are known as fin regions. In one embodiment, a plurality of source/drain regions 104 are formed adjacent to each location where a gate 106a, 106b, 106c, 108 will be formed. Source/drain regions 104 may be formed by etching, photolithography, or any other means for removing semiconductor material now know or later developed.

A dielectric layer 122 is formed on substrate 102 in the trenches created during the formation of the source/drain regions 104. As explained above, in one embodiment, source/drain regions 104 may be formed by etching trenches in substrate 102. Dielectric layer 122 may be disposed in the resulting trenches on either side of source/drain regions 104. Dielectric layer 122 may include an oxide. In one embodiment, dielectric layer 122 includes silicon dioxide. Dielectric layer 122 may be formed by deposition, or any other means of forming a dielectric layer now know or later developed.

A dielectric layer 110 is formed on source/drain regions 104. In one embodiment, dielectric 110 is disposed on each source/drain region 104 at a plurality of locations where a plurality of gates 106, 108 will be disposed. In one embodiment, dielectric layer 110 may be formed by deposition, or any other means of forming a dielectric layer now known or later developed. In one embodiment, dielectric layer 110 may include a dielectric with a lower dielectric constant than silicon dioxide (low-k dielectric). In one embodiment, dielectric layer 110 may include silicon nitride. Short channel gates 106a, 106b, 106c and long channel gates 108 may be formed on dielectric layers 110. The number of short channel gates 106a, 106b, 106c and long channel gates 108 of an IC will vary by individual circuit design. This illustrated example shows three short channel gates 106a, 106b, 106c and one long channel gate 108 for simplicity and clarity. The present disclosure is not limited to the configuration shown. In one embodiment gates 106a, 106b, 106c, 108 include an electrically conductive material. In one embodiment, gates 106a, 106b, 106c, 108 may be formed by a replacement metal gate (RMG) process, or any other method of forming a metal gate now know or later developed. An example of an RMG process may include growing a polysilicon gate (not shown), or otherwise depositing a polysilicon gate on the source/drain regions 104 with any now known or later developed method. The polysilicon gate is known as a dummy gate (not shown). The dummy gate is eventually removed by etching, photolithography, or any other method of removing semiconductor material now know or later developed. After removal of the dummy gate, an electrically conductive metal is filled in the place left by the dummy gate to form an RMG. In one embodiment, the electrically conductive metal may include aluminum. In one embodiment, the electrically conductive metal may include tungsten. A dielectric layer 112 may be formed on precursor FinFET structure 100 to provide further electrical isolation.

In one embodiment, dielectric layer 112 includes an oxide. In one embodiment, dielectric layer 112 includes silicon dioxide.

Figure 2:
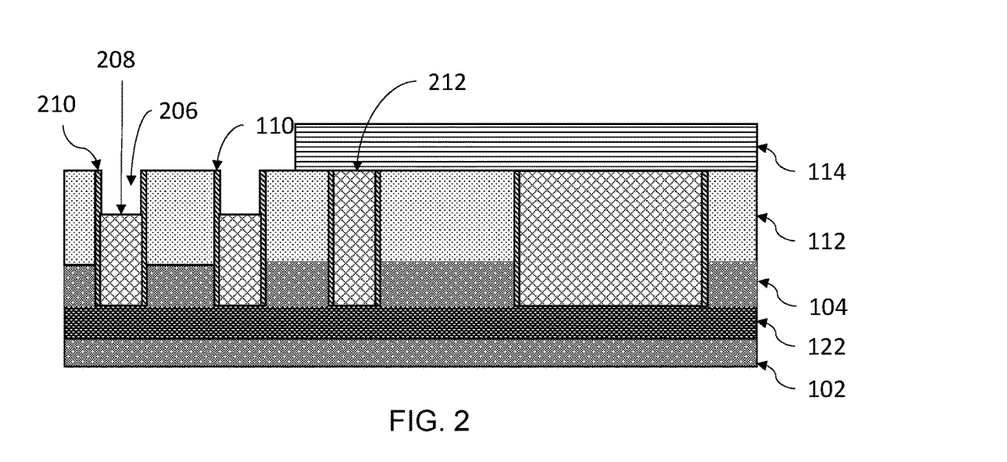
FIG. 2 depicts a cross-sectional view of processes in forming a selective mask in accordance with an illustrative embodiment.
Figure 3:
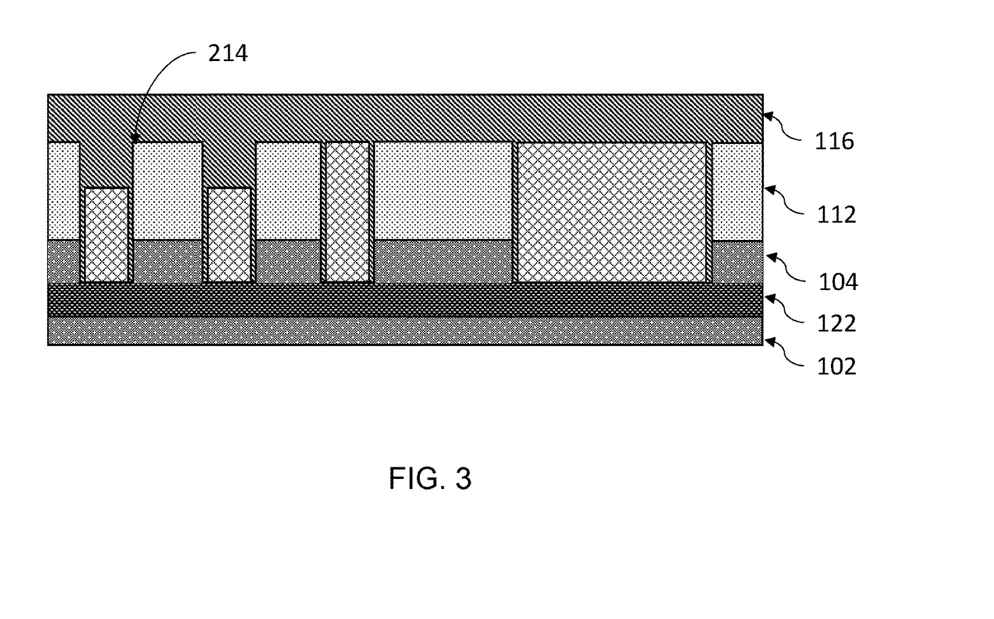
FIG. 3 depicts a cross-sectional view of processes in forming selective SAC capping in accordance with an illustrative embodiment.

As illustrated in FIG. 2, according to various embodiments, a mask 114 is selectively applied to precursor FinFET structure 100. In one embodiment, mask 114 may include a photoresist mask. Mask 114 is selectively applied to precursor FinFET structure 100 at locations where a SAC capping will not be applied. As discussed above, SAC caps may be applied to electrically isolate gates from local interconnects when components are very close together due to technology scaling. In some long channel gates 108, a SAC cap may not be required because the local interconnects are not very close to the gates 108. As explained herein, some circuit designs also require that some gates 106c be electrically connected to local interconnects. In both described cases, a SAC cap is not required, and mask 114 is applied. In one embodiment, mask 114 may include a photoresist mask. In one embodiment, mask 114 may be formed by photolithography. However, many gates 106a, 106b may be designed to be electrically isolated from local interconnects and require a SAC cap. Mask 114 is not applied to gates 106a, 106b that are designed to have a SAC cap. Once mask 114 is formed, a portion of each unmasked gate 106a, 106b is removed by etching. The etching may include dry plasma etching, wet etching, or any other method of etching now know or later developed. After the material removal process, each unmasked gate 106a, 106b includes an opening 206 where conductive gate material was removed. Openings 206 may extend from an etched surface 208 of gate 106a, 106b to an original surface level 210 of gate 106a, 106b. Original surface level 210 of gate 106a, 106b may be equal to a surface 212 of masked gates 106c, 108. After the material removal process, mask 114 is removed, as illustrated in FIG. 3. In one embodiment, mask 114 is removed by oxygen plasma ashing.

Figure 4:
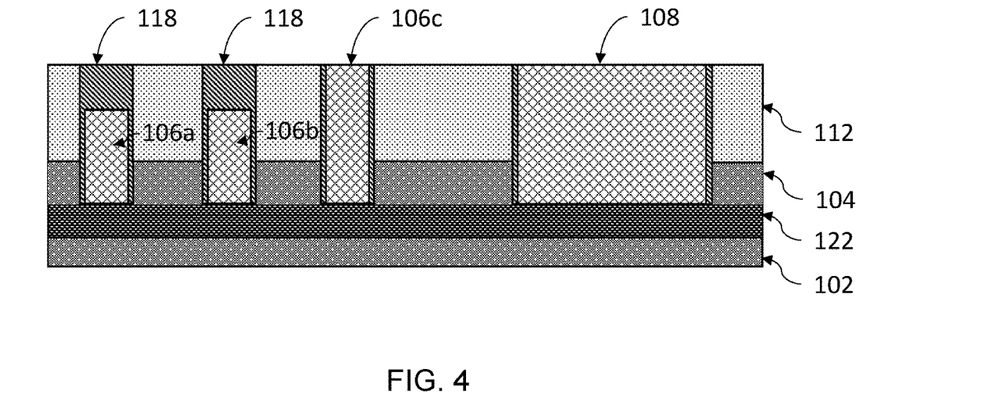
FIG. 4 depicts a cross-sectional view of processes in forming selective SAC capping in accordance with an illustrative embodiment.

As illustrated in FIG. 3, according to various embodiments after mask 114 is removed, a dielectric layer 116 is developed on the FinFET structure. Dielectric layer 116 may be disposed on the FinFET structure such that dielectric layer 116 fills each opening 206. In one embodiment, dielectric layer 116 may extend from etched surface 208 of gate 106a, 106b, to above an upper surface 214 adjacent to gate 106a, 106b. In one embodiment, dielectric layer 116 includes a low-k dielectric. In one embodiment, dielectric layer 116 includes silicon nitride, silicon oxide, or a combination of silicon nitride and silicon oxide. As illustrated in FIG. 4, any portion of dielectric layer 116 extending above adjacent upper surface 214 is removed by chemical mechanical polishing (CMP) or any other method of removing layers of material now know or later developed. Dielectric layer 116 is removed leaving uncapped gates 106c, 108 exposed, and leaving a SAC cap 118 on gates 106a, 106b.

Figure 5:
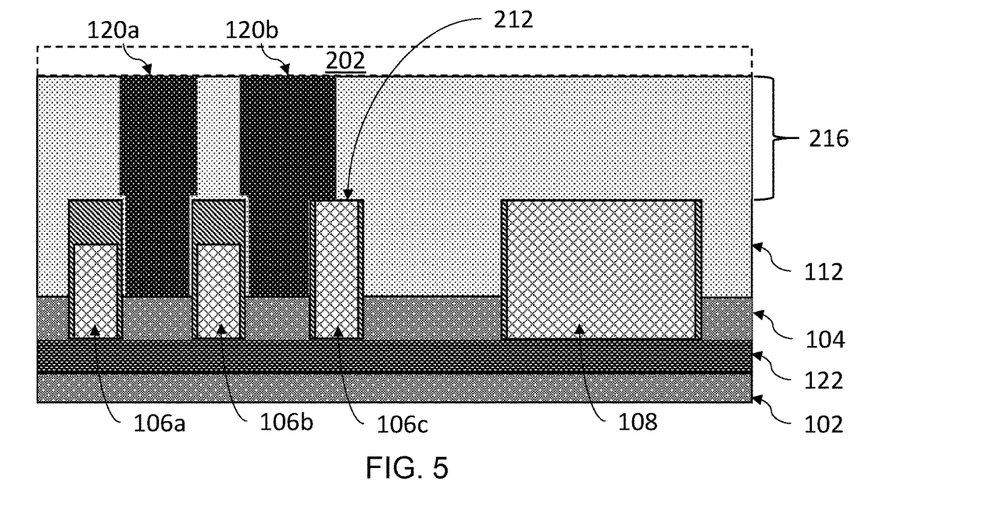
FIG. 5 depicts a cross-sectional view of processes in forming local interconnects in accordance with an illustrative embodiment.
Figure 6:
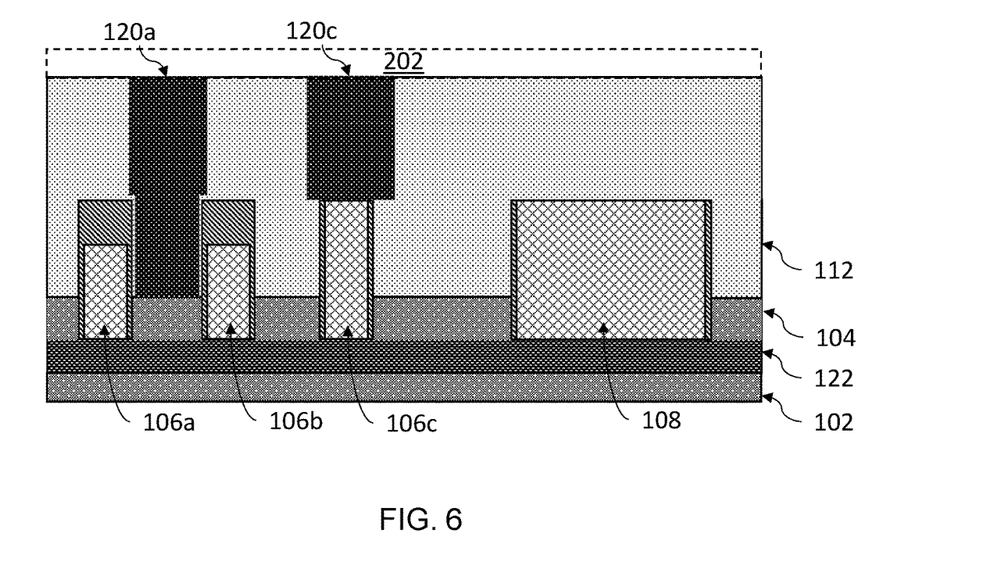
FIG. 6 depicts a cross-sectional view of processes in forming local interconnects in accordance with an illustrative embodiment.

FIGS. 5 and 6 show example embodiments including the FinFET structure described in FIG. 4 along with local interconnects 120a, 120b, 120c disposed on the FinFET structure. The local interconnects 120a, 120b, 120c (or referred to as TS contacts) may be formed by deposition of a dielectric layer 216 on the structure shown in FIG. 4. After the deposition of dielectric layer 216, openings (not shown) may be formed through dielectric layer 216 and optionally through dielectric layer 112 until source/drain regions 104 are exposed. In one embodiment, the openings (not shown) are formed by steps including photolithography and dry plasma etching. In one embodiment, a contact mask (not shown) may be formed by photolithography at locations where local interconnects will not be formed. The openings (not shown) may be formed through dielectric layers 216 and optionally 112 by dry plasma etching. The contact mask (not shown) may then be removed by ashing. A conductive metal may then be deposited in the openings (not shown) to form local interconnects 120a, 120b, 120c. Silicide may be formed at the interface between silicon source/drain regions 104 and local interconnects 120a, 120b. Any conductive material on the surface of dielectric layer 216 may be removed by CMP.

In the embodiment shown in FIG. 5, local interconnect 120a is electrically connected to source/drain region 104 adjacent to gates 106a, 106b and electrically isolated from gates 106a, 106b that include SAC cap 118. Local interconnect 120b is electrically isolated from capped gate 106b because SAC cap 118 on gate 106b may prevent electrical contact between gate 106b and local interconnect 120b. In this embodiment, local interconnect 120b is disposed on and electrically connected to source/drain region 104 adjacent to gates 106b, 106c and surface 212 of uncapped gate 106c. FIG. 6 shows an alternative embodiment that includes local interconnect 120c. Local interconnect 120c is disposed on and forms an electrical contact with surface 212 of uncapped gate 106c, but does not extend to source/drain region 104. In this embodiment, local interconnect forms an electrical connection to gate 106c, and does not form an electrical connection to source/drain region 104.

Figure 7:
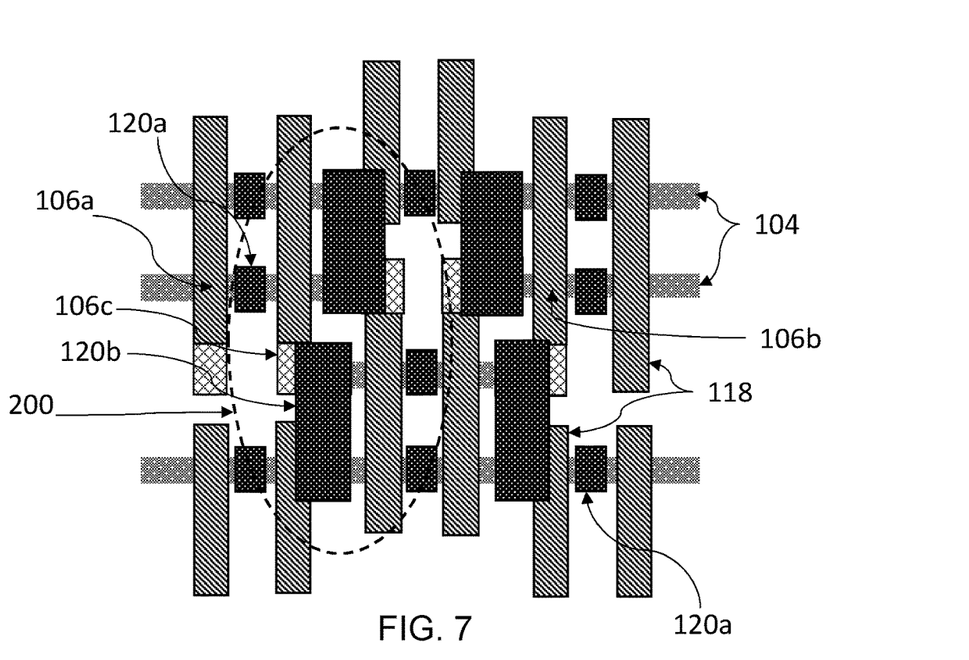
FIG. 7 depicts a plan view of an example layout of a cross-couple structure in accordance with an illustrative embodiment.
Figure 8:
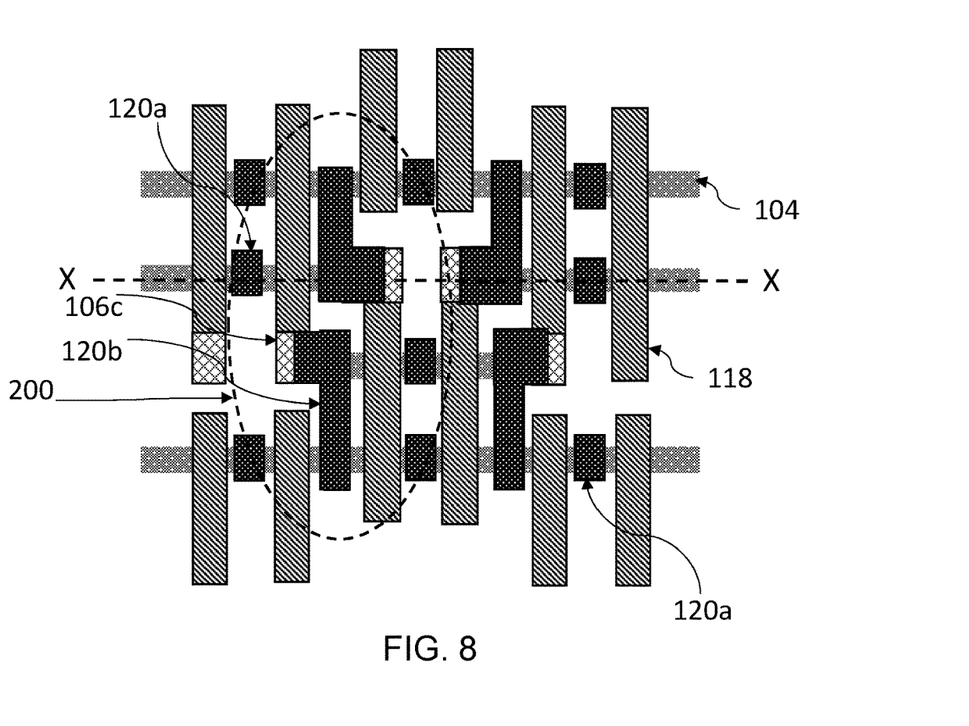
FIG. 8 depicts a plan view of an example layout of a cross-couple structure in accordance with an illustrative embodiment.
Figure 9:
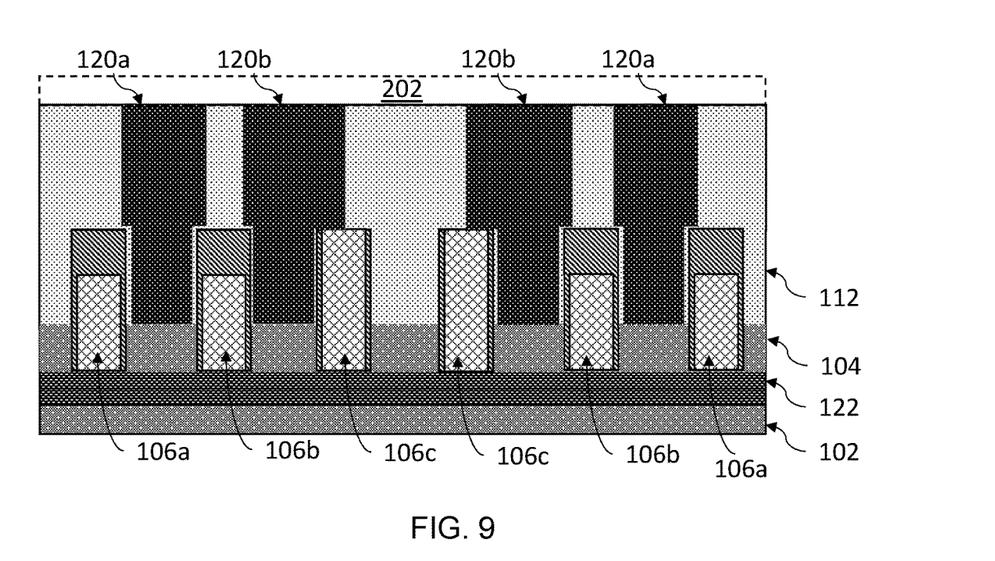
FIG. 9 depicts a cross-sectional view of the layout of FIG. 8 taken along line X.

One element of IC design that requires an electrical connection between gate 106c and local interconnect 120b as shown in FIG. 5 is known as a cross-couple. FIG. 7 shows a plan view of one example embodiment of a cross-couple configuration. One example of a cross-couple is highlighted by area 200. In this example, local interconnects 120b are disposed on and electrically connected to uncapped gates 106c and source/drain region 104 adjacent to gates 106c. In this embodiment, local interconnects 120b are electrically isolated from capped gates 106a, 106b. Due to the selective SAC caps 118 present on gates 106a, 106b designed to be electrically isolated from local interconnects 120b, local interconnects 120b may be designed such that local interconnects 120b are wide enough to make the electrical connection between gate 106c and source/drain region 104 adjacent to gate 106c. In this embodiment, local interconnects may be at least partially disposed on capped gates 106a, 106b, and remain electrically isolated from gates 106a, 106b. As shown in FIG. 8, in an alternative embodiment, local interconnects 120b may be widened only near uncapped gate 106c. In this example embodiment, local interconnect 120b may be L-shaped. The example cross-couple configuration shown in FIG. 8 is shown in further detail in FIG. 9. FIG. 9 shows a cross sectional view of the cross couple configuration shown in FIG. 8 taken along line X.

FIG. 9 shows a cross section of an example embodiment including a cross couple configuration. As shown in FIG. 9, in this embodiment local interconnects 120b are disposed on and electrically connected to uncapped gates 106c and source/drain region 104 adjacent to gates 106c. In this embodiment, local interconnects 120b are electrically isolated from capped gates 106a, 106b. Due to the selective SAC caps 118 present on gates 106a, 106b designed to be electrically isolated from local interconnects 120b, local interconnects 120b may be designed such that local interconnects 120b are disposed on and form an electrical connection between gate 106c and source/drain region 104 adjacent to gate 106c. In this embodiment, local interconnects may be at least partially disposed on capped gates 106a, 106b, and remain electrically isolated from gates 106a, 106b.

Figure 10:
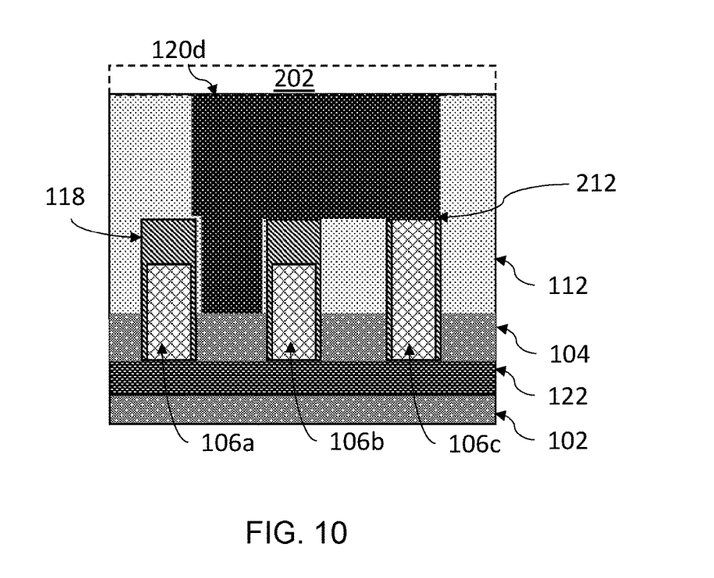
FIG. 10 depicts a cross-sectional view of a jumper configuration in accordance with an illustrative embodiment.

FIG. 10 shows a cross section of an alternative embodiment known as a jumper. In this embodiment, local interconnect 120d is disposed on and extends over at least one capped gate 106b. Local interconnect 120d is disposed on and forms an electrical connection between surface 212 of uncapped gate 106c and source/drain region 104 that is not directly adjacent to gate 106c. Local interconnect 120d may be partially disposed on and remain electrically isolated from capped local interconnects 106a, 106b.

Figure 11:
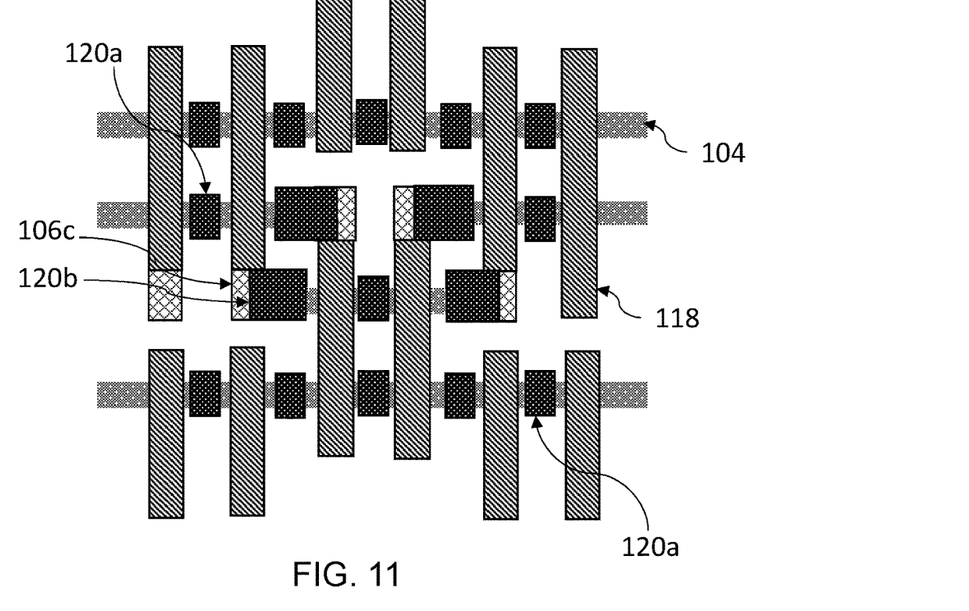
FIG. 11 depicts a plan view of an example layout of a cross-couple structure in accordance with an illustrative embodiment.
Figure 12:
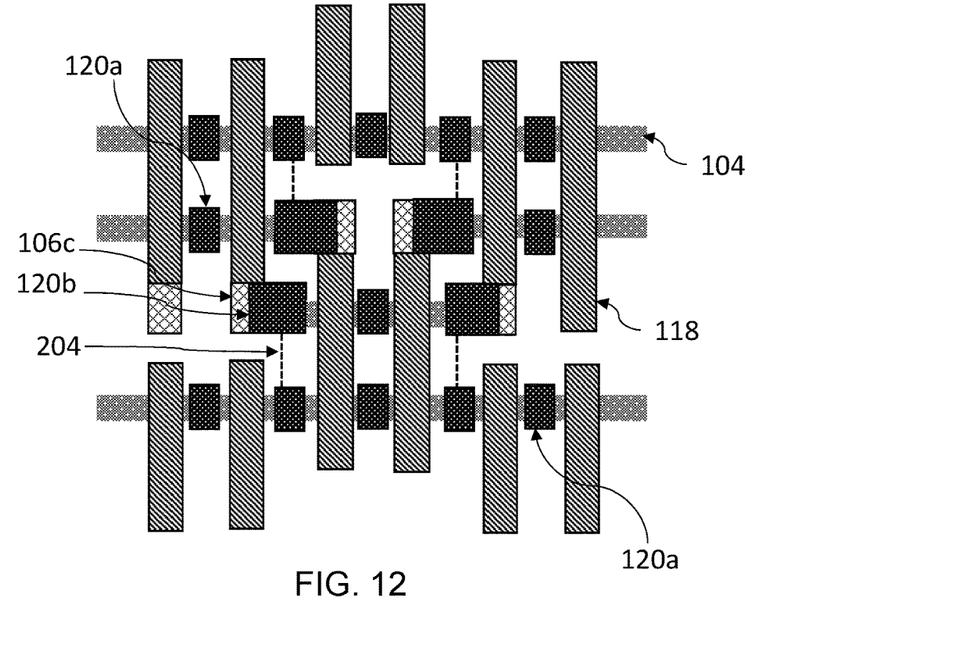
FIG. 12 depicts a plan view of an example layout of a cross-couple structure in accordance with an illustrative embodiment.

FIGS. 11 and 12 show plan views of another example embodiment of a cross couple configuration. In this example embodiment, local interconnects 120b do not extend between multiple source/drain regions 104. In this embodiment, local interconnects 120b may be formed separately on each source/drain region 104, and then connected by vias 204 through a subsequent layer of the IC, such as the first metallization layer 202.

The disclosed embodiments may be useful in manufacturing a number of different ICs. In one particular example, the disclosed embodiments may be used to manufacture a static random access memory (SRAM) cell (not shown). A SRAM cell is a volatile semiconductor memory chip that includes, in part, a plurality of adjacent FinFETs. As described above with respect to FIG. 4, each FinFET may include gate 106, 108 disposed on substrate 102. Each FinFET may include source/drain regions 104 formed on the substrate adjacent to each gate 106, 108. Each FinFET may include dielectric 110 disposed between each gate 106, 108 and adjacent source/drain regions 104. The plurality of FinFETs of the SRAM cell may include SAC caps 118 disposed on gates 106a, 106b that are designed to remain electrically isolated from local interconnects 120. However, gates 106c designed to electrically connect to local interconnects 120, and long channel gates 108 may not have an SAC cap 118. As discussed herein, SAC caps 118 may not be disposed on gates 108 that are not very close to local interconnects 120, even when gate 108 is designed to remain electrically isolated from local interconnects 120.

As discussed above with respect to FIG. 9., the SRAM cell may include local interconnect 120b. Local interconnect 120b may be disposed on and electrically connected to gate 106c and source/drain region 104 that is adjacent to gate 106c. The SRAM cell may include first metallization layer 202. With reference to FIG. 6, in one embodiment, local interconnect 120b may be disposed on and electrically connected to gate 106c, and electrically connected to metallization layer 202. Returning to FIG. 9, in one embodiment local interconnect 120b may be disposed on and electrically connected gate 106c and source/drain region 104 adjacent to gate 106c, and electrically connected to first metallization layer 202. As explained above, SAC caps 118 are not applied to each gate 106, 108. Local interconnect 120b is disposed on and electrically connected to uncapped gate 106c and is electrically isolated from capped gate 106b.

In each of the embodiments described above, local interconnects 120 may include trench silicide contacts (TS). In one embodiment, local interconnects 120 may include an electrical conductor. In one embodiment, local interconnects 120 include tungsten.

The selective SAC capping disclosed above provides a less expensive, more efficient, and simpler method of forming very small FinFET structures (below 28 nm, particularly 10 nm and beyond). As explained above, a SAC cap is required to electrically isolate a gate from a local interconnect because the components are in such close proximity. However the SAC cap increases the difficulty of forming an electrical connection to the gate, when such a configuration is desired. By selectively forming SAC caps, SAC caps are only formed where they are desired in an IC design. For example, SAC caps may be beneficial when gates are directly adjacent to local interconnects in a design layout, where it is desirable to electrically isolate the gate from the local interconnect. Since SAC caps are only formed where desired in an IC design, it may not be necessary to remove any SAC caps to form electrical connections to gates. Manufacturing may become simpler and may result in higher yields. Further, the resulting IC may be more robust and less prone to failure.

The present disclosure is presented for purposed of illustration and description, and is not intended to be exhaustive or limited to the invention in the form disclosed. Many modifications and variations will be apparent to those of ordinary skill in the art without departing from the scope and spirit of the described embodiments. The embodiments were chosen and described in order to best explain the principles of the present disclosure, the practical application, and to enable others of ordinary skill in the art to understand the present disclosure for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

We claim:

1. A method comprising:
   providing a precursor FinFET structure including:
     a substrate including a fin region,
     a plurality of gates disposed on the fin region of the substrate,
     a plurality of source/drain regions within the fin region of the substrate adjacent to each of the gates, and
     a dielectric disposed between each gate and the plurality of source/drain regions adjacent to each gate;
   selectively masking a portion of the plurality of gates;
   removing a portion of each unmasked gate; and
   applying a capping layer to replace each removed portion of the gates; and
   forming a local interconnect between a first one of the plurality of gates with a capping layer and a second one of the plurality of gates without a capping layer, wherein the local interconnect is electrically connected to the second one of the plurality of gates, and wherein the capping layer applied on the first one of the plurality of gates prevents an electrical connection between the local interconnect and the first one of the plurality of gates.

2. The method of claim 1, wherein the plurality of gates of the precursor FinFET structure include replacement metal gates (RMGs).

3. The method of claim 1, wherein applying the capping layer includes applying a low-k dielectric.

4. The method of claim 1, wherein the local interconnect contacts the capping layer disposed on the first one of the plurality of gates.

5. The method of claim 4, wherein the local interconnected is formed at least partially on an upper surface of the capping layer disposed on the first one of the plurality of gates.

6. The method of claim 5, wherein the first one of the plurality of gates is adjacent to the second one of the plurality of gates.

7. The method of claim 1, wherein the local interconnect is electrically connected to one of the source/drain regions adjacent to the second one of the plurality of gates.

8. The method of claim 7, wherein the local interconnect is electrically connected to a metallization layer.

9. The method of claim 1, wherein the local interconnect is electrically connected to a metallization layer.

10. The method of claim 1, wherein the local interconnect includes a trench silicide contact.

* * * * *